United States Patent
Hsu et al.

(10) Patent No.: US 10,219,390 B2
(45) Date of Patent: Feb. 26, 2019

(54) FABRICATION METHOD OF PACKAGING SUBSTRATE HAVING EMBEDDED PASSIVE COMPONENT

(71) Applicant: Unimicron Technology Corp., Taoyuan (TW)

(72) Inventors: Shih-Pin Hsu, Taoyuan (TW); Zhao-Chong Zeng, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 486 days.

(21) Appl. No.: 14/853,992

(22) Filed: Sep. 14, 2015

(65) Prior Publication Data

US 2016/0007483 A1 Jan. 7, 2016

Related U.S. Application Data

(62) Division of application No. 12/967,791, filed on Dec. 14, 2010, now Pat. No. 9,179,549.

(30) Foreign Application Priority Data

Aug. 13, 2010 (TW) ................................ 99127019 A (51) Int. Cl.
*H05K 3/32* (2006.01)
*H05K 1/18* (2006.01)
(Continued)

(52) U.S. Cl.
CPC ......... *H05K 3/32* (2013.01); *H01L 23/49822* (2013.01); *H05K 1/186* (2013.01);
(Continued)

(58) Field of Classification Search
CPC ...... H05K 3/32; H05K 3/4682; H05K 3/4697; H05K 3/30; H05K 3/305; H05K 3/301;
(Continued)

(56) References Cited

U.S. PATENT DOCUMENTS 5,966,593 A * 10/1999 Budnaitis ........... G01R 1/07314
257/E23.067
6,884,652 B2 * 4/2005 Huang ................ H01L 21/4832
257/E23.125

(Continued)

*Primary Examiner* — Peter DungBa Vo
*Assistant Examiner* — Kaying Kue
(74) *Attorney, Agent, or Firm* — JCIPRNET (57) ABSTRACT

A carrier board having two opposite surfaces is provided and a releasing film and a metal layer are formed on the two opposite surfaces respectively. Each metal layer formed with positioning pads is covered with a first hot-melt-dielectric layer where a passive component is disposed. The passive component has upper and lower surfaces each having electrode pads. Each first hot-melt-dielectric layer is disposed on a core board having a cavity to receive the passive component. A second hot-melt-dielectric layer is stacked on each core board. The first and second hot-melt-dielectric layers are heat pressed to form two dielectric layer units each having a top surface and a bottom surface. The carrier board and the releasing films are removed to separate the dielectric layer units. Wiring layers are formed on each top surface and each bottom surface and electrically connected to the electrode pads of the upper and lower surfaces respectively.

4 Claims, 8 Drawing Sheets

(51) Int. Cl.
*H05K 3/46* (2006.01)
*H01L 23/498* (2006.01)

(52) U.S. Cl.
CPC ......... *H05K 3/4644* (2013.01); *H05K 3/4682* (2013.01); *H01L 2924/0002* (2013.01); *H01L 2924/00013* (2013.01); *H05K 2201/0195* (2013.01); *H05K 2201/10015* (2013.01); *H05K 2201/10636* (2013.01); *Y02P 70/611* (2015.11); *Y10T 29/4913* (2015.01)

(58) Field of Classification Search
CPC ........... H05K 1/186; H05K 2201/0195; H05K 2201/10015; H05K 2201/10636; Y10T 29/4913; Y10T 29/49146; H01L 2224/29599; H01L 2924/002; H01L 2924/00
USPC ........................................... 29/841, 846, 832
See application file for complete search history.

(56) References Cited

U.S. PATENT DOCUMENTS

| | | | | |
|---|---|---|---|---|
| 7,222,421 B2* | 5/2007 | Nakamura | ........... | H05K 3/0058 156/248 |
| 7,594,317 B2* | 9/2009 | Nakamura | ........... | H05K 3/0097 29/825 |
| 7,638,879 B2* | 12/2009 | Jiang | ..................... | H01L 21/561 257/766 |
| 7,727,813 B2* | 6/2010 | Otremba | ................ | H01L 21/568 257/E23.02 |
| 7,841,076 B2* | 11/2010 | Fujii | ..................... | H01Q 9/0407 257/700 |
| 8,176,627 B2* | 5/2012 | Kobayashi | .......... | H01L 21/4857 29/846 |
| 8,394,225 B2* | 3/2013 | Nakamura | ........... | H05K 3/4652 156/182 |
| 8,539,668 B2* | 9/2013 | Okada | ................ | B32B 38/1841 29/729 |
| 8,959,760 B2* | 2/2015 | Niki | ..................... | H05K 3/4682 174/255 |
| 9,275,877 B2* | 3/2016 | Lin | ........................ | H01L 24/97 |
| 9,320,149 B2* | 4/2016 | Jin | ........................ | H05K 1/185 |
| 9,806,050 B2* | 10/2017 | Chou | ..................... | H01L 21/568 |
| 2005/0155222 A1* | 7/2005 | Nakamura | ........... | H05K 3/0058 29/830 |
| 2007/0124924 A1* | 6/2007 | Nakamura | ........... | H05K 3/0097 29/830 |
| 2011/0289770 A1* | 12/2011 | Okada | ................ | B32B 38/1841 29/829 |
| 2015/0223341 A1* | 8/2015 | Kim | ........................ | H05K 3/007 361/761 |
| 2015/0245473 A1* | 8/2015 | Shimizu | ............... | H05K 1/0298 257/778 |
| 2016/0105967 A1* | 4/2016 | Choi | ..................... | H05K 1/183 174/251 |
| 2016/0174381 A1* | 6/2016 | Lee | ........................ | H05K 1/185 361/761 |

* cited by examiner

FABRICATION METHOD OF PACKAGING SUBSTRATE HAVING EMBEDDED PASSIVE COMPONENT

CROSS-REFERENCE TO RELATED APPLICATION

This is a divisional application of and claims the priority benefit of U.S. patent application Ser. No. 12/967,791, filed on Dec. 14, 2010, now allowed, which claims the priority benefit of Taiwan patent application serial no. 099127019, filed Aug. 13, 2010. The entirety of each of the above-mentioned patent applications is hereby incorporated by reference herein and made a part of this specification.

BACKGROUND OF THE INVENTION

1. Field of the Invention

The present invention relates generally to packaging substrates and fabrication methods thereof, and more particularly, to a packaging substrate having at least an embedded passive component and a fabrication method thereof.

2. Description of Related Art

Passive components are increasingly demanded along with the development of semiconductor packaging technologies. Passive components, such as capacitors, resistors or inductors, allow signals to pass through without any change. In contrast to an active component, a passive component cannot control the flow of electrons. Therefore, when voltage or current changes, the resistance or impedance of the passive component does not change.

Figure 1:
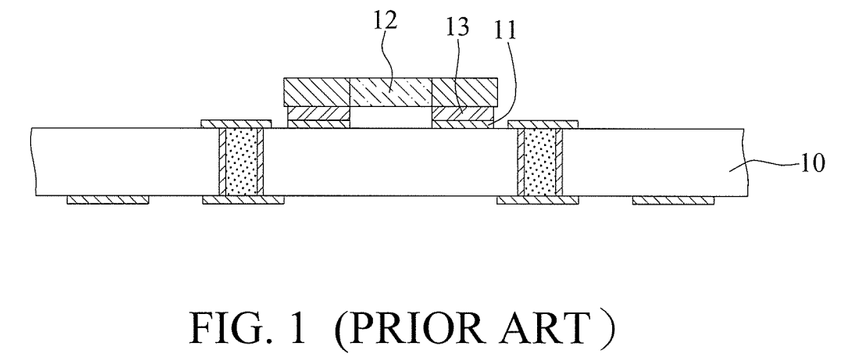
FIG. 1 is a cross-sectional view showing a conventional packaging substrate having a passive component.

Various products driven by electrical power require passive components for electronic loop control. The passive components can be applied in computer, communication and consumer electronic industries and so on. FIG. 1 shows a packaging substrate with a passive component. Referring to FIG. 1, a passive component 12 is mounted through a plurality of solder bumps 13 on conductive pads 11 of a substrate 10.

However, the passive component 12 mounted on the substrate 10 increases the height of the overall packaging structure, which does not meet the minimization trend of electronic products. Further, since the passive component 12 is mounted on an outer surface of the substrate 10, it leads to a long signal transmission path between an inner circuit of the substrate 10 and the passive component, thereby adversely affecting the electrical performance of the structure. In addition, the substrate 10 has conductive traces disposed on the surface thereof, thereby limiting the area available for mounting of the passive component 12.

Therefore, it is imperative to provide a packaging substrate having at least an embedded passive component and a fabrication method thereof so as to overcome the above drawbacks.

SUMMARY OF THE INVENTION

In view of the above drawbacks of the prior art, it is an object of the present invention to provide a packaging substrate having at least an embedded passive component and a fabrication method thereof so as to reduce the height of the structure.

Another object of the present invention is to provide a packaging substrate having at least an embedded passive component and a fabrication method thereof so as to shorten the signal transmission path.

A further object of the present invention is to provide a packaging substrate having at least an embedded passive component and a fabrication method thereof so as to allow more passive components to be disposed in the packaging substrate as compared with the prior art.

In order to achieve the above and other objects, the present invention provides a packaging substrate having at least an embedded passive component, which comprises: a core board having at least a cavity; a dielectric layer unit having an upper surface and a lower surface, and encapsulating the core board and filling the cavity of the core board; a plurality of positioning pads embedded in the lower surface of the dielectric layer unit; at least a passive component having upper and lower surfaces each having a plurality of electrode pads disposed thereon, the passive component being embedded in the dielectric layer unit so as to be received in the cavity of the core board at a position corresponding to the positioning pads; a first wiring layer disposed on the upper surface of the dielectric layer unit and electrically connected to the electrode pads of the upper surface of the passive component through a plurality of first conductive vias; and a second wiring layer disposed on the lower surface of the dielectric layer unit and electrically connected to the electrode pads of the lower surface of the passive component through a plurality of second conductive vias.

In the above-described packaging substrate, the dielectric layer unit can be made up of a plurality of hot-melt dielectric layers. In particular, the dielectric layer unit can comprise: a first hot-melt dielectric layer with the positioning pads embedded therein and the passive component disposed thereon; and a second hot-melt dielectric layer bonded with the first hot-melt dielectric layer such that the core board and the passive component are embedded in the first and second hot-melt dielectric layers.

In the above-described packaging substrate, the electrode pads of the lower surface of the passive component can correspond in position to the positioning pads, and the second conductive vias can penetrate the positioning pads, respectively.

In the above-described packaging substrate, built-up structures can be disposed on the upper surface of the dielectric layer unit and the first wiring layer and on the lower surface of the dielectric layer unit and the second wiring layer. Further, a solder mask layer can be disposed on each of the built-up structures, wherein the solder mask layer has a plurality of openings through which portions of the outmost wiring layer of the built-up structure are exposed to serve as conductive pads.

Alternatively, a built-up structure can be disposed on the upper surface of the dielectric layer unit and the first wiring layer; and solder mask layers can be disposed on the built-up structure and on the lower surface of the dielectric layer unit and the second wiring layer, wherein each of the solder mask layers has a plurality of openings such that portions of the second wiring layer and the outmost wiring layer of the built-up structure are exposed to serve as conductive pads.

The present invention provides another packaging substrate having at least an embedded passive component, which comprises: a core board having at least a cavity; a dielectric layer unit having an upper surface and a lower surface, and encapsulating the core board and filling the cavity of the core board; a plurality of solder bumps embedded in the lower surface of the dielectric layer unit; at least a passive component having upper and lower surfaces each having a plurality of electrode pads disposed thereon, wherein the passive component is embedded in the dielectric layer unit so as to be received in the cavity of the core board, the electrode pads of the lower surface of the passive component being mounted on the solder bumps; a first wiring layer disposed on the upper surface of the dielectric layer unit and electrically connected to the electrode pads of the upper surface of the passive component through a plurality of first conductive vias; and a second wiring layer disposed on the lower surface of the dielectric layer unit and electrically connected to the electrode pads of the lower surface of the passive component through the solder bumps.

In the above-described packaging substrate, built-up structures can be disposed on the upper surface of the dielectric layer unit and the first wiring layer and on the lower surface of the dielectric layer unit and the second wiring layer. Further, a solder mask layer can be disposed on each of the built-up structures, wherein the solder mask layer has a plurality of openings through which portions of the outmost wiring layer of the built-up structure are exposed to serve as conductive pads.

Alternatively, a built-up structure can be disposed on the upper surface of the dielectric layer unit and the first wiring layer; and solder mask layers can be disposed on the built-up structure and on the lower surface of the dielectric layer unit and the second wiring layer, wherein each of the solder mask layers has a plurality of openings such that portions of the second wiring layer and the outmost wiring layer of the built-up structure are exposed to serve as conductive pads.

The present invention further provides a fabrication method of a packaging substrate having at least an embedded passive component, which comprises: providing a carrier board having two opposite surfaces and sequentially forming a releasing film and a metal layer on each of the opposite surfaces of the carrier board; forming a plurality of positioning pads on each of the metal layers; covering each of the metal layers with a first hot-melt dielectric layer; disposing at least a passive component on each of the first hot-melt dielectric layers at a position corresponding to the positioning pads, wherein the passive component has upper and lower surfaces each having a plurality of electrode pads disposed thereon; disposing on each of the first hot-melt dielectric layers a core board having at least a cavity so as to receive the passive component on the first hot-melt dielectric layer in the cavity; stacking a second hot-melt dielectric layer on each of the core boards; heat pressing the first and second hot-melt dielectric layers so as to form two dielectric layer units each having an upper surface and a lower surface and each having the corresponding core board and passive component embedded therein and the corresponding positioning pads embedded in the lower surface thereof; removing the carrier board and the releasing films so as to separate the two dielectric layer units; and forming a first wiring layer on the upper surface of each of the dielectric layer units and forming a second wiring layer on the lower surface of each of the dielectric layer units, wherein the first wiring layer is electrically connected to the electrode pads of the upper surface of the passive component through a plurality of first conductive vias, and the second wiring layer is electrically connected to the electrode pads of the lower surface of the passive component through a plurality of second conductive vias.

In the above-described method, the electrode pads on the lower surface of the passive component can correspond in position to the positioning pads, and the second conductive vias can penetrate the positioning pads, respectively. The method can further comprise forming built-up structures on the upper surface of the dielectric layer unit and the first wiring layer and on the lower surface of the dielectric layer unit and the second wiring layer. In addition, the method can comprise forming a solder mask layer on each of the built-up structures, and forming a plurality of openings in the solder mask layer such that portions of the outmost wiring layer of the built-up structure are exposed to serve as conductive pads.

The present invention discloses another fabrication method of a packaging substrate having at least an embedded passive component, which comprises: providing a carrier board having two opposite surfaces and sequentially forming a releasing film and a metal layer on each of the opposite surfaces of the carrier board; forming a plurality of solder bumps on each of the metal layers; disposing on the solder bumps on each of the metal layers at least a passive component, wherein the passive component has upper and lower surfaces each having a plurality of electrode pads disposed thereon, and the electrode pads of the lower surface of the passive component are disposed on the solder bumps; covering each of the metal layers with a first hot-melt dielectric layer having at least an open area such that the passive component and the solder bumps on the metal layer are exposed through the open area; disposing on each of the first hot-melt dielectric layers a core board having at least a cavity so as to receive the corresponding passive component and solder bumps in the cavity; stacking a second hot-melt dielectric layer on each of the core boards; heat pressing the first and second hot-melt dielectric layers so as to form two dielectric layer units each having an upper surface and a lower surface and each having the corresponding core board and passive component embedded therein and the corresponding solder bumps embedded in the lower surface thereof; removing the carrier board and the releasing films so as to separate the two dielectric layer units; and forming a first wiring layer on the upper surface of each of the dielectric layer units and forming a second wiring layer on the lower surface of each of the dielectric layer units, wherein the first wiring layer is electrically connected to the electrode pads of the upper surface of the passive component through a plurality of first conductive vias, and the second wiring layer is electrically connected to the electrode pads of the lower surface of the passive component through the solder bumps.

The above-described method can further comprise forming built-up structures on the upper surface of the dielectric layer unit and the first wiring layer and on the lower surface of the dielectric layer unit and the second wiring layer. Further, the method can comprise forming a solder mask layer on each of the built-up structures, and forming a plurality of openings in the solder mask layer such that portions of the outmost wiring layer of the built-up structure are exposed to serve as conductive pads.

The present invention provides another fabrication method of a packaging substrate having at least an embedded passive component, which comprises: providing a carrier board having two opposite surfaces and sequentially forming a releasing film and a metal layer on each of the opposite surfaces of the carrier board; forming a plurality of positioning pads on each of the metal layers; covering each of the metal layers with a first hot-melt dielectric layer; disposing at least a passive component on each of the first hot-melt dielectric layers at a position corresponding to the positioning pads, wherein the passive component has upper and lower surfaces each having a plurality of electrode pads disposed thereon; disposing on each of the first hot-melt dielectric layers a core board having at least a cavity so as to receive the passive component on the first hot-melt dielectric layer in the cavity; stacking a second hot-melt dielectric layer on each of the core boards; heat pressing the first and second hot-melt dielectric layers so as to form two dielectric layer units each having an upper surface and a lower surface and each having the corresponding core board and passive component embedded therein and the corresponding positioning pads embedded in the lower surface thereof; forming a first wiring layer on the upper surface of each of the dielectric layer units, the first wiring layer being electrically connected to the electrode pads of the upper surface of the passive component through a plurality of first conductive vias; forming a built-up structure on each of the first wiring layers; removing the carrier board and the releasing films so as to separate the two dielectric layer units each having the corresponding first wiring layer and built-up structure formed thereon; and forming a second wiring layer on the lower surface of each of the dielectric layer units, the second wiring layer being electrically connected to the electrode pads of the lower surface of the passive component through a plurality of second conductive vias.

In the above-described method, the electrode pads of the lower surface of the passive component can correspond to the positioning pads, and the second conductive vias can penetrate the positioning pads. Further, the method can comprise forming solder mask layers on the built-up structure and on the lower surface of the dielectric layer unit and the second wiring layer and forming a plurality of openings in each of the solder mask layers such that portions of the second wiring layer and the outmost wiring layer of the built-up structure are exposed to serve as conductive pads.

The present invention provides another fabrication method of a packaging substrate having at least an embedded passive component, which comprises: providing a carrier board having two opposite surfaces and sequentially forming a releasing film and a metal layer on each of the opposite surfaces of the carrier board; fan ling a plurality of solder bumps on each of the metal layers; disposing on the solder bumps on each of the metal layers at least a passive component, wherein the passive component has upper and lower surfaces each having a plurality of electrode pads disposed thereon, and the electrode pads of the lower surface of the passive component are disposed on the solder bumps; covering each of the metal layers with a first hot-melt dielectric layer having at least an open area such that the passive component and the solder bumps on the metal layer are exposed through the open area; disposing on each of the first hot-melt dielectric layers a core board having at least a cavity so as to receive the corresponding passive component and solder bumps in the cavity; stacking a second hot-melt dielectric layer on each of the core boards; heat pressing the first and second hot-melt dielectric layers so as to form two dielectric layer units each having an upper surface and a lower surface and each having the corresponding core board and passive component embedded therein and the corresponding solder bumps embedded in the lower surface thereof; forming a first wiring layer on the upper surface of each of the dielectric layer units, the first wiring layer being electrically connected to the electrode pads of the upper surfaces of the passive component through a plurality of first conductive vias; forming a built-up structure on each of the first wiring layers; removing the carrier board and the releasing films so as to separate the two dielectric layer units each having the corresponding first wiring layer and built-up structure formed thereon; and forming a second wiring layer on the lower surface of each of the dielectric layer units, the second wiring layer being electrically connected to the electrode pads of the lower surface of the passive component through the solder bumps.

The above-described method further comprises forming solder mask layers on the built-up structure and on the lower surface of the dielectric layer unit and the second wiring layer and forming a plurality of openings in each of the solder mask layers such that portions of the second wiring layer and the outmost wiring layer of the built-up structure are exposed to serve as conductive pads.

Therefore, by embedding a passive component in a core board and a dielectric layer unit, the present invention provides a packaging substrate with reduced height, shortens the signal transmission path between the passive component and an inner wiring layer and accordingly allows more passive components to be disposed in such a packaging substrate without affecting the wiring layout.

DETAILED DESCRIPTION OF PREFERRED EMBODIMENTS

The following illustrative embodiments are provided to illustrate the disclosure of the present invention, these and other advantages and effects can be apparent to those in the art after reading this specification.

First Embodiment

FIGS. 2A to 2G are cross-sectional views showing a fabrication method of a packaging substrate having at least an embedded passive component according to a first embodiment of the present invention.

Figure 2A:
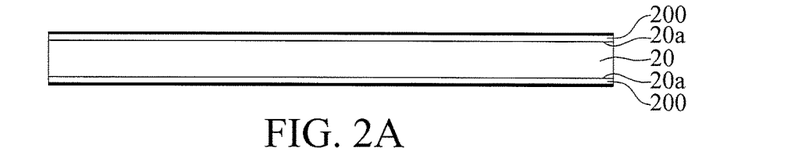
FIGS. 2A to 2G are cross-sectional views showing a fabrication method of a packaging substrate having at least an embedded passive component according to a first embodiment of the present invention, wherein FIG. 2C' shows another embodiment of FIG. 2C.

Referring to FIG. 2A, a carrier board 20 with two opposite surfaces 20a is provided, and a releasing film 200 and a metal layer 201 are sequentially formed on each of the two opposite surfaces 20a of the carrier board 20.

Figure 2B:
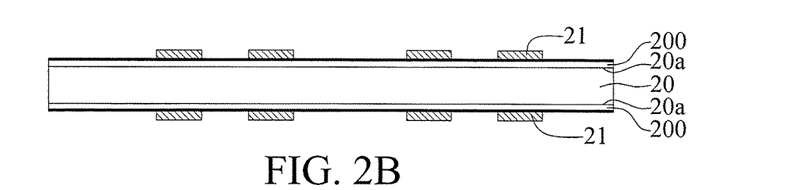

Referring to FIG. 2B, a plurality of positioning pads 21 is formed on each of the metal layers 201.

Figure 2C:
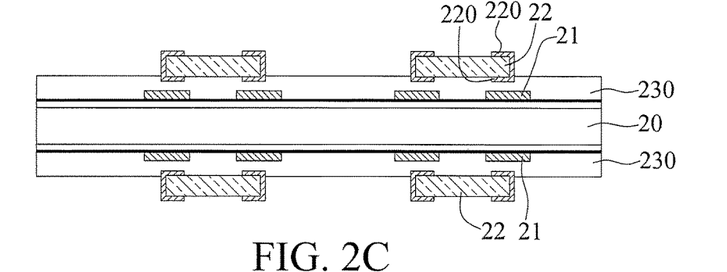

Referring to FIG. 2C, a first hot-melt dielectric layer 230 is formed to cover each of the metal layers 201 on the two opposite surfaces 20a of the carrier board 20; and at least a passive component 22 is disposed on each of the first hot-melt dielectric layers 230 at a position corresponding to the positioning pads 21, wherein the passive component 22 has upper and lower surfaces each having a plurality of electrode pads 220 disposed thereon, and the electrode pads 220 of the lower surface of the passive component 22 correspond in position to the positioning pads 21, respectively.

Referring to FIG. 2C', a plurality of positioning pads 21' or 21" arranged in different patterns can be alternatively provided such that the passive component 22 corresponds to a different position relative to the positioning pads 21' or 21".

Figure 2D:
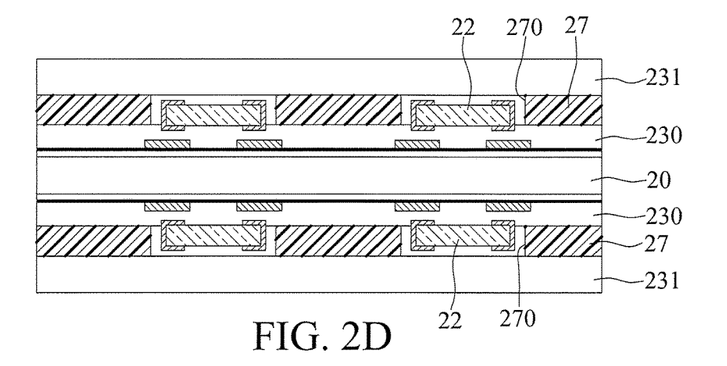

Referring to FIG. 2D, a core board 27 having at least a cavity 270 is disposed on each of the first hot-melt dielectric layers 230 so as to receive the passive component 22 on the first hot-melt dielectric layer 230 in the cavity 270. Further, a second hot-melt dielectric layer 231 is stacked on each of the core boards 27.

Figure 2E:
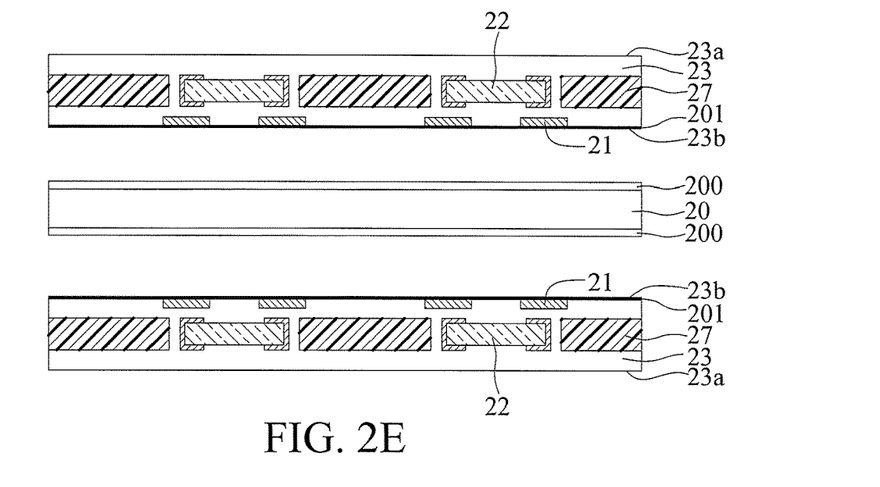

Referring to FIG. 2E, the first and second holt-melt dielectric layers 230, 231 are heat pressed so as to form two dielectric layer units 23 each having an upper surface 23a and a lower surface 23b and each having the corresponding core board 27 and passive component 22 embedded therein and the corresponding positioning pads 21 embedded in the lower surface 23b thereof. Thereafter, the carrier board 20 and the releasing films 200 are removed so as to separate the two dielectric layer units 23.

Figure 2F:
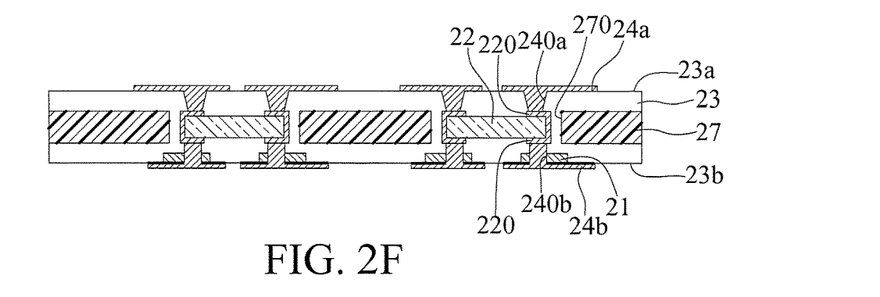

Referring to FIG. 2F, a first wiring layer 24a is formed on the upper surface 23a of each of the dielectric layer units 23, and a second wiring layer 24b is formed on the lower surface 23b of each of the dielectric layer units 23. The first wiring layer 24a is electrically connected to the electrode pads 220 of the upper surface of the passive component 22 through a plurality of first conductive vias 240a, and the second wiring layer 24b is electrically connected to the electrode pads 220 of the lower surface of the passive component 22 through a plurality of second conductive vias 240b, with the second conductive vias 240b penetrating the positioning pads 21, respectively.

The second wiring layer 24b can be formed by using the metal layer 201 as a current conductive path for electroplating.

Figure 2G:
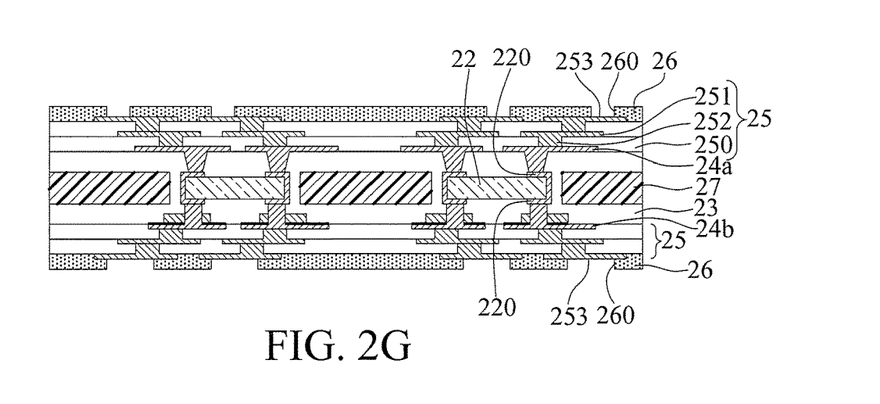

Referring to FIG. 2G, built-up structures 25 are further formed on the upper surface 23a of the dielectric layer unit 23 and the first wiring layer 24a and on the lower surface 23b of the dielectric layer unit 23 and the second wiring layer 24b. Each of the built-up structures 25 comprises at least a dielectric layer 250, a wiring layer 251 formed on the dielectric layer 250 and a plurality of conductive vias 252 formed in the dielectric layer 250 for electrically connecting adjacent wiring layers.

Further, a solder mask layer 26 is formed on each of the built-up structures 25 and a plurality of openings 260 are formed in the solder mask layer 26 such that portions of the outmost wiring layer of the built-up structure 25 are exposed from the solder mask layer 26 to serve as conductive pads 253.

Second Embodiment

FIGS. 3A to 3G show a fabrication method of a packaging substrate having at least an embedded passive component according to a second embodiment of the present invention. In the present embodiment, solder bumps are formed instead of the positioning pads as in the first embodiment.

Figure 3A:
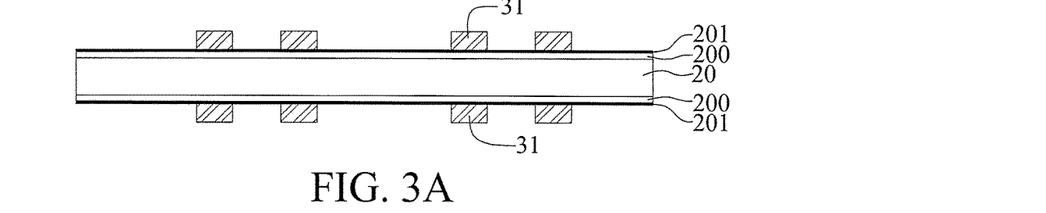
FIGS. 3A to 3G are cross-sectional views showing a fabrication method of a packaging substrate having at least an embedded passive component according to a second embodiment of the present invention.

Referring to FIG. 3A, a carrier board 20 as shown in FIG. 2A is provided and a plurality of solder bumps 31 are formed on each of the metal layers 201 of the carrier board 20.

Figure 3B:
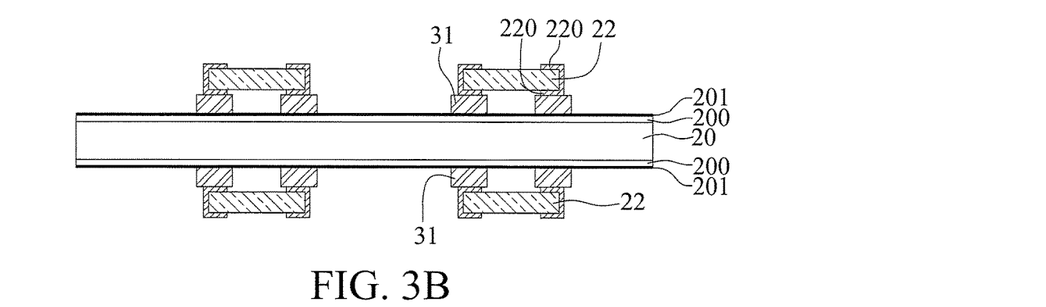

Referring to FIG. 3B, at least a passive component 22 as shown in FIG. 2C is disposed on the solder bumps 31 on each of the metal layers 201 via the electrode pads 220 of the lower surface thereof.

Figure 3C:
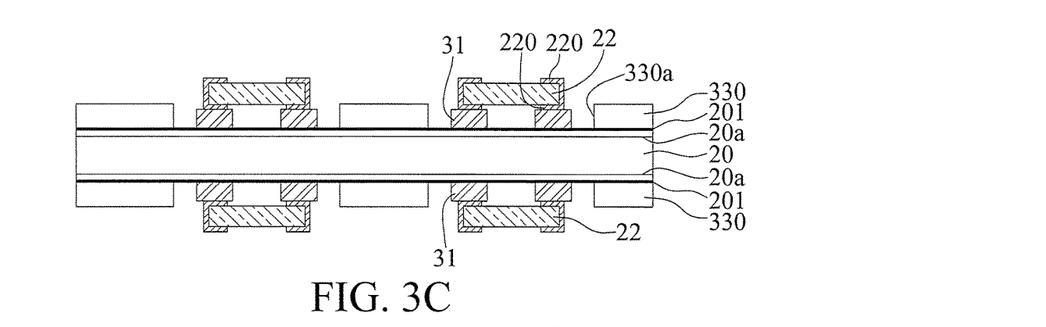

Referring to FIG. 3C, a first hot-melt dielectric layer 330 having at least an open area 330a is formed on each of the metal layers 201 such that the passive component 22 and the solder bumps 31 on the metal layer 201 are exposed from the open area 330a.

Figure 3D:
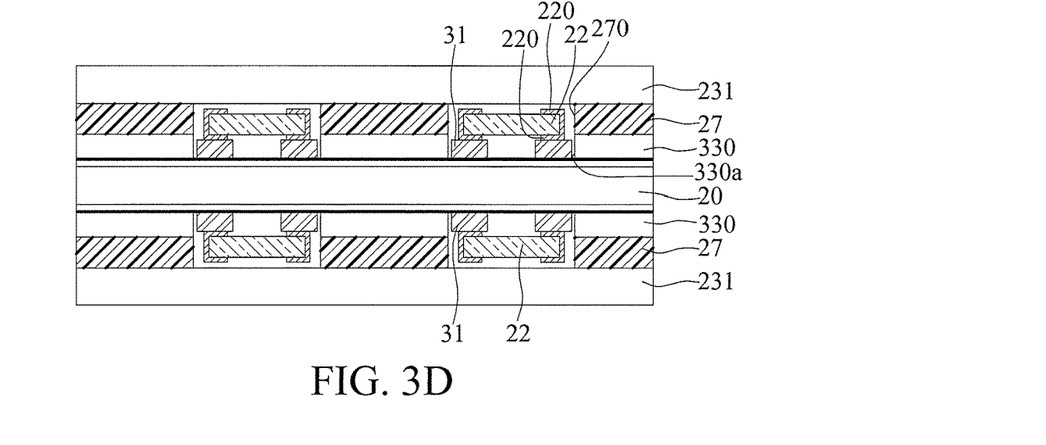

Referring to FIG. 3D, a core board 27 having at least a cavity 270 is disposed on each of the first hot-melt dielectric layers 330 so as to receive the corresponding passive component 22 and the solder bumps 31 in the cavity 270. Further, a second hot-melt dielectric layer 231 is stacked on each of the core boards 27.

Figure 3E:
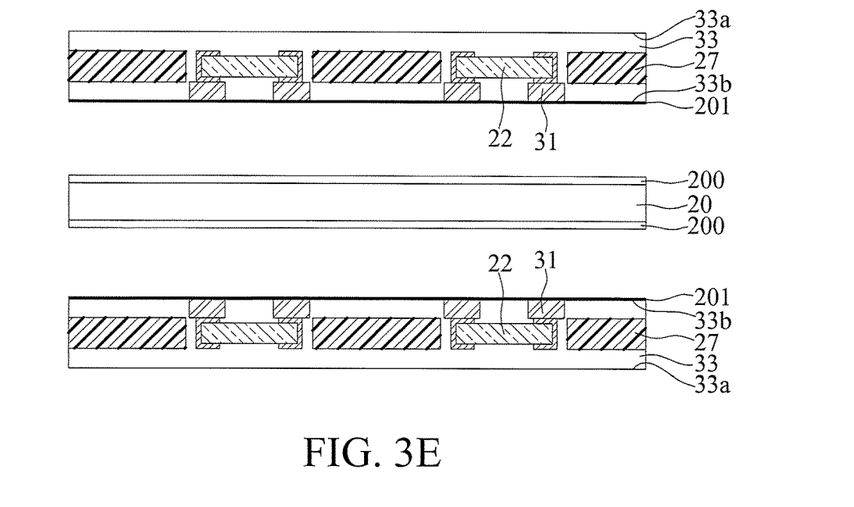

Referring to FIG. 3E, the first and second hot-melt dielectric layers 330, 231 are heat pressed so as to form two dielectric layer units 33 each having an upper surface 33a and a lower surface 33b and each having the corresponding core board 27 and passive component 22 embedded therein and the corresponding solder bumps 31 embedded in the lower surface 23b thereof. Thereafter, the carrier board 20 and the releasing films 200 are removed so as to separate the two dielectric layer units 33.

Figure 3F:
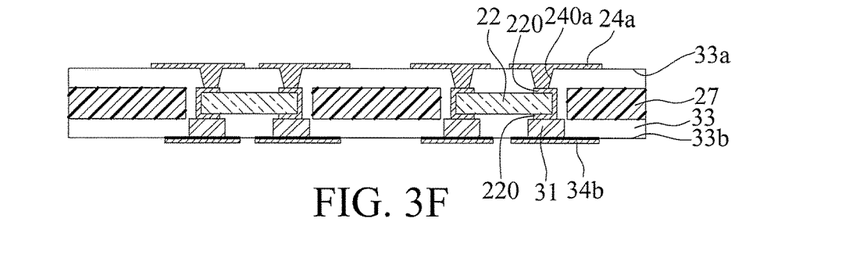

Referring to FIG. 3F, a first wiring layers 24a is formed on the upper surface 33a of each of the dielectric layer units 33, and a second wiring layer 34b is formed on the lower surface 33b of each of the dielectric layer units 33. The first wiring layer 24a is electrically connected to the electrode pads 220 of the upper surface of the passive component 22 through a plurality of first conductive vias 240a, and the second wiring layer 34b is electrically connected to the electrode pads 220 of the lower surface of the passive component 22 through the solder bumps 31.

The second wiring layer 34b can be formed by using the metal layer 201 as a current conductive path for electroplating.

Figure 3G:
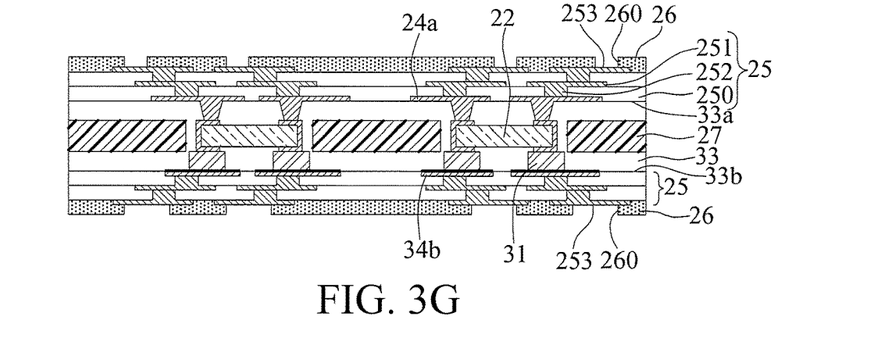

Referring to FIG. 3G, built-up structures 25 and solder mask layers 26 as shown in FIG. 2G are further formed on the upper and lower surfaces 33a, 33b of the dielectric layer unit 33 and the first and second wiring layers 24a, 34b.

Third Embodiment

FIGS. 4A to 4D show a fabrication method of a packaging substrate having at least an embedded passive component according to a third embodiment of the present invention.

Figure 4A:
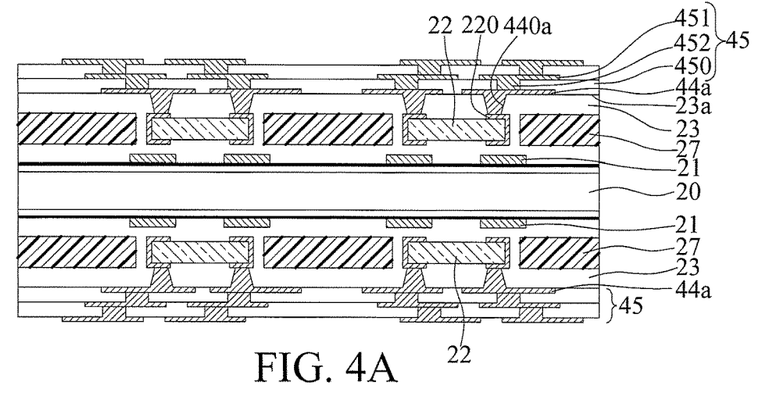
FIGS. 4A to 4D are cross-sectional views showing a fabrication method of a packaging substrate having at least an embedded passive component according to a third embodiment of the present invention.

Referring to FIG. 4A, after the dielectric layer units 23 are formed by heat pressing as in FIG. 2D, a first wiring layer 44a is formed on the upper surface 23a of each of the dielectric layer units 23 and electrically connected to the electrode pads 220 of the upper surface of the passive component 22 through a plurality of first conductive vias 440a. Further, a built-up structure 45 is formed on each of the first wiring layers 44a, wherein the built-up structure 45 comprises at least a dielectric layer 450, a wiring layer 451 formed on the dielectric layer 450 and a plurality of conductive vias 452 disposed in the dielectric layer 450 for electrically connecting adjacent wiring layers.

Figure 4B:
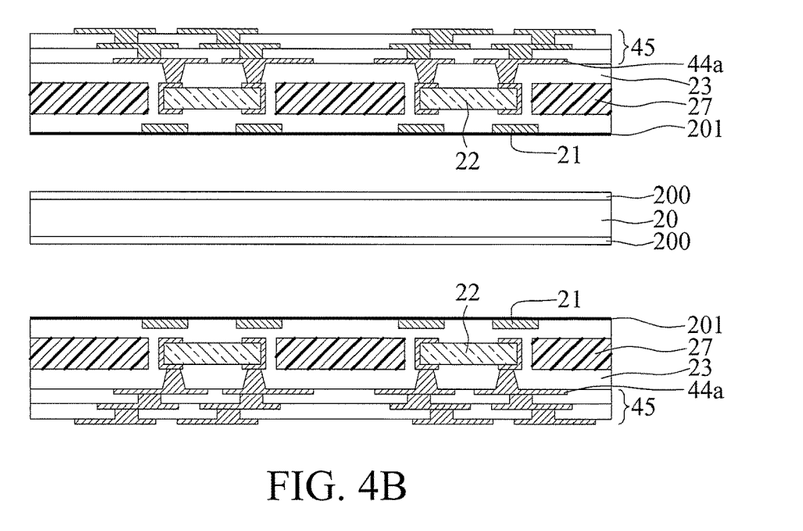

Referring to FIG. 4B, the carrier board 20 and the releasing films 200 are removed so as to separate the two dielectric layer units 23 each having the corresponding first wiring layer 44a and built-up structure 45 formed thereon.

Figure 4C:
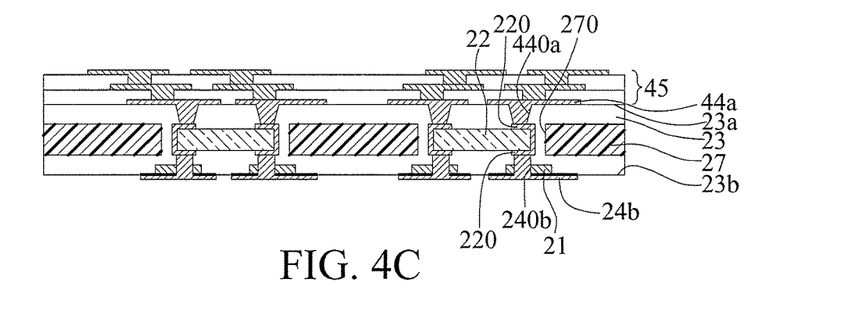

Referring to FIG. 4C, a second wiring layer 24b is formed on the lower surface 23b of each of the dielectric layer units 23, and electrically connected to the electrode pads 220 of the lower surface of the passive component 22 through a plurality of second conductive vias 240b, the second conductive vias 240b penetrating the positioning pads 21, respectively.

The second wiring layer 24b can be formed by using the metal layer 201 as a current conductive path for electroplating.

Figure 4D:
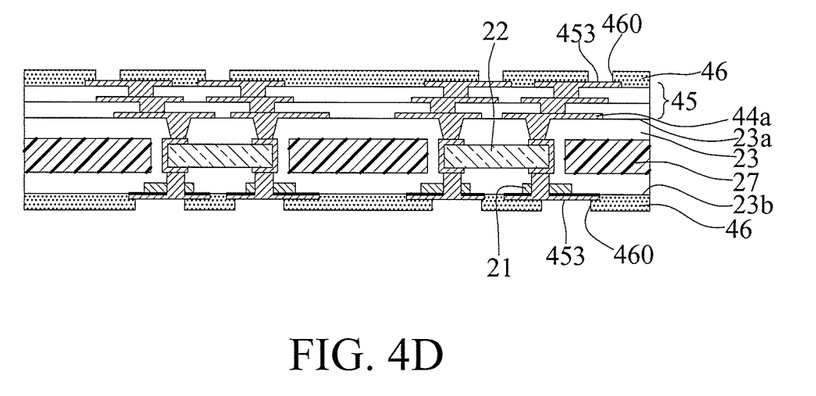

Referring to FIG. 4D, solder mask layers 46 are formed on the built-up structure 45 and on the lower surface 23b of the dielectric layer unit 23 and the second wiring layer 24b, and a plurality of openings 460 are formed in each of the solder mask layers 46 such that portions of the outmost wiring layer of the built-up structure 45 and the second wiring layer 24b are exposed to serve as conductive pads 453.

Fourth Embodiment

Figure 5A:
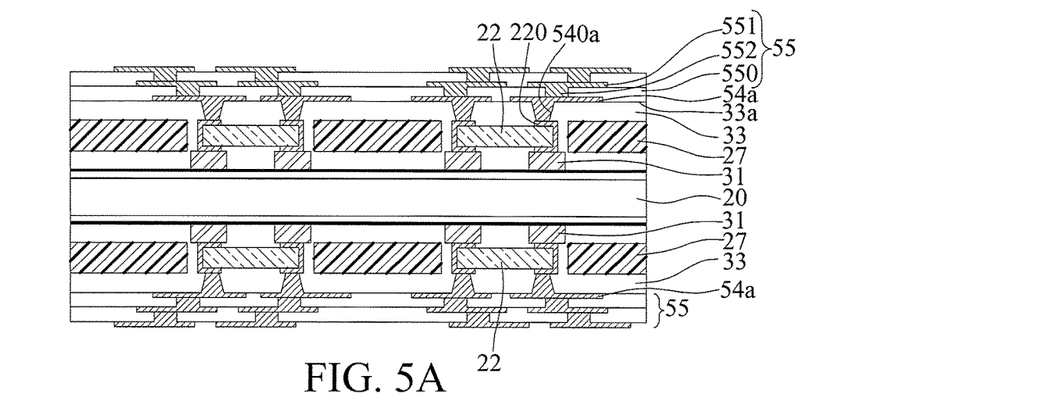
FIGS. 5A to 5C are cross-sectional views showing a fabrication method of a packaging substrate having at least an embedded passive component according to a fourth embodiment of the present invention.
Figure 5B:
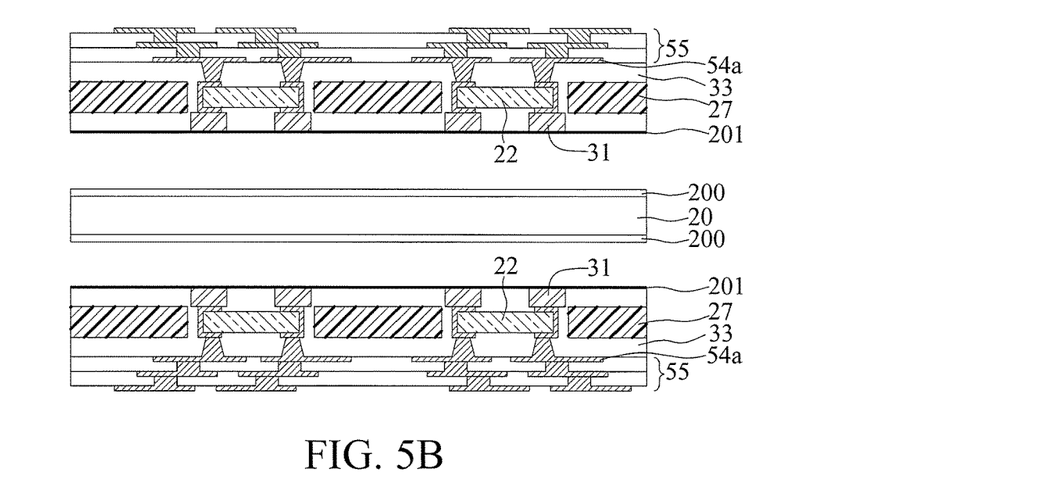
Figure 5C:
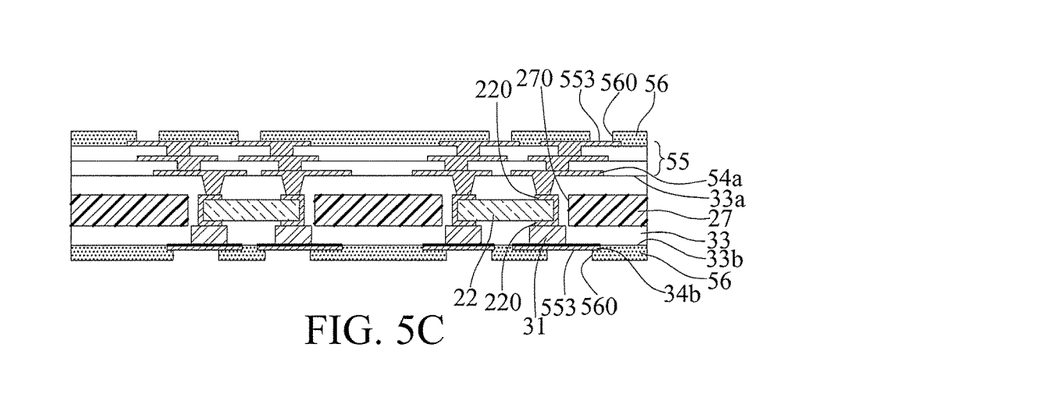

FIGS. 5A to 5C show a fabrication method of a packaging substrate having at least a passive component according to a fourth embodiment of the present invention.

Referring to FIG. 5A, after the dielectric layer units 33 are formed by heat pressing as in FIG. 3D, a first wiring layer 54a is formed on the upper surface 33a of each of the dielectric layer units 33, and electrically connected to the electrode pads 220 of the upper surface of the passive component 22 through a plurality of first conductive vias 540a. Further, a built-up structure 55 is formed on each of the first wiring layers 54a. The built-up structure 45 comprises at least a dielectric layer 550, a wiring layer 551 formed on the dielectric layer 550 and a plurality of conductive vias 552 formed in the dielectric layer 550 for electrically connecting adjacent wiring layers.

Referring to FIG. 5B, the carrier board 20 and the releasing films 200 are removed so as to separate the two dielectric layer units 33 each having the corresponding first wiring layer 54a and built-up structure 55 formed thereon.

Referring to FIG. 5C, a second wiring layer 34b is formed on the lower surface 33b of each of the dielectric layer units 33, and electrically connected to the electrode pads 220 of the lower surfaces of the passive component 22 through the solder bumps 31.

The second wiring layer 34b can be formed by using the metal layer 201 as a current conductive path for electroplating.

Further, solder mask layers 56 are formed on the built-up structure 55 and on the lower surface 33b of the dielectric layer unit 33 and the second wiring layer 34b, and a plurality of openings 560 are formed in each of the solder mask layers 56 such that portions of the outmost wiring layer of the built-up structure 55 and the second wiring layer 34b are exposed to serve as conductive pads 553.

A packaging substrate obtained through the fabrication methods of the first and third embodiments comprises: a core board 27 having at least a cavity 270; a dielectric layer unit 23 having an upper surface 23a and a lower surface 23b and encapsulating the core board 27 and filling the cavity 270; a plurality of positioning pads 21 embedded in the lower surface 23b of the dielectric layer unit 23; at least a passive component 22 having upper and lower surfaces each having a plurality of electrode pads 220 disposed thereon, the passive component 22 being embedded in the dielectric layer unit 23 so as to be received in the cavity 270 of the core board 27 at a position corresponding to the positioning pads 21; a first wiring layer 24a or 44a disposed on the upper surface 23a of the dielectric layer unit 23 and electrically connected to the electrode pads 220 of the upper surface of the passive component 22 through a plurality of first conductive vias 240a or 440a; and a second wiring layer 24b disposed on the lower surface 23b of the dielectric layer unit 23 and electrically connected to the electrode pads 220 of the lower surface of the passive component 22 through a plurality of second conductive vias 240b.

Therein, the dielectric layer unit 33 is made up of a plurality of hot-melt dielectric layers. In particular, the dielectric layer unit 33 is composed of a first hot-melt dielectric layer 230 with the positioning pads 21 embedded therein and the passive component 22 disposed thereon; and a second hot-melt dielectric layer 231 bonded with the first hot-melt dielectric layer 230 such that the core board 27 and the passive component 22 are embedded in the first and second hot-melt dielectric layers 230, 231.

The electrode pads 220 of the lower surface of the passive component 22 correspond in position to the positioning pads 21, and the second conductive vias 240b penetrate the positioning pads 21, respectively.

In the first embodiment, the packaging substrate has a symmetrical structure, wherein built-up structures 25 are disposed on the upper surface 23a of the dielectric layer unit 23 and the first wiring layer 24a and on the lower surface 23b of the dielectric layer unit 23 and the second wiring layer 24b; and a solder mask layer 26 is disposed on each of the built-up structures 25 and has a plurality of openings 260 through which portions of the outmost wiring layer of the built-up structure 25 are exposed to serve as conductive pads 253.

In the third embodiment, the structure of the packaging substrate is not symmetrical, and a built-up structure 45 is disposed on the upper surface 23a of the dielectric layer unit 23 with the first wiring layer 44a. Further, solder mask layers 46 are disposed on the built-up structure 45 and on the lower surface 23b of the dielectric layer unit 23 and the second wiring layer 24b and each of the solder mask layers 46 has a plurality of openings 460 such that portions of the outmost wiring layer of the built-up structure 45 and the second wiring layer 24b are exposed to serve as conductive pads 453.

A packaging substrate obtained through the fabrication methods of the second and fourth embodiments comprises: a core board 27 having at least a cavity 270; a dielectric layer unit 33 having an upper surface 33a and a lower surface 33b and encapsulating the core board 27 and filling the cavity 270; a plurality of solder bumps 31 embedded in the lower surface 33b of the dielectric layer unit 33; at least a passive component 22 having upper and lower surfaces each having a plurality of electrode pads 220 disposed thereon, wherein the passive component 22 is embedded in the dielectric layer unit 33 so as to be received in the cavity 270 of the core board 27, the electrode pads 220 of the lower surface of the passive component 22 being mounted on the solder bumps 31; a first wiring layer 24a or 54a disposed on the upper surface 23a of the dielectric layer unit 23 and electrically connected to the electrode pads 220 of the upper surface of the passive component 22 through a plurality of first conductive vias 240a or 540a; and a second wiring layer 34b disposed on the lower surface 33b of the dielectric layer unit 33 and electrically connected to the electrode pads 220 of the lower surface of the passive component 22 through the solder bumps 31.

In the second embodiment, the packaging substrate has a symmetrical structure, and built-up structures 25 are disposed on the upper surface 33a of the dielectric layer unit 33 and the first wiring layer 24a and on the lower surface 33b of the dielectric layer unit 33 and the second wiring layer 34b. Further, a solder mask layer 26 is disposed on each of the built-up structures 25 and has a plurality of openings 260 such that portions of the outmost wiring layer of the built-up structure 25 are exposed to serve as conductive pads 253.

In the fourth embodiment, the structure of the packaging substrate is not symmetrical, and a built-up structure 55 is disposed on the upper surface 33a of the dielectric layer unit 33 and the first wiring layer 54a. Further, solder mask layers 56 are disposed on the built-up structure 55 and on the lower surface 33b of the dielectric layer unit 33 and the second wiring layer 34b, and each of the solder mask layers 56 has a plurality of openings 560 such that portions of the outmost wiring layer of the built-up structure 55 and the second wiring layer 34*b* are exposed to serve as conductive pads 553.

Therefore, by embedding the passive component 22 in the core board 27 and the dielectric layer unit 23 or 33, the present invention reduces the height of the overall packaging structure so as to facilitate minimization of electronic products and also shortens the signal transmission path between the passive component 22 and inner wiring layers (the first and second wiring layers 24*a*, 44*a*, 54*a*, 24*b*, 34*b*) so as to effectively reduce electrical losses and achieve preferred electrical performance.

Further, since the passive component 22 is embedded in the dielectric layer unit 23, the present invention allows more passive component 22 to be disposed in the packaging substrate without affecting the wiring layout (the built-up structure 25, 45, 55, the first and second wiring layers 24*a*, 44*a*, 54*a*, 24*b*, 34*b*), thereby meeting the demands for high operating functions and processing capabilities of electronic devices.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a packaging substrate having at least an embedded passive component, comprising:
   providing a carrier board having two opposite surfaces and sequentially forming a releasing film and a metal layer on each of the opposite surfaces of the carrier board;
   forming a plurality of positioning pads on each of the metal layer on each of the opposite surfaces;
   covering each of the metal layer on each of the opposite surfaces with a first hot-melt dielectric layer;
   disposing at least a passive component on each of the first hot-melt dielectric layer on each of the metal layer at a position corresponding to the positioning pads, wherein the passive component has upper and lower surfaces each having a plurality of electrode pads disposed thereon;
   disposing on each of the first hot-melt dielectric layer on each of the metal layer a core board having at least a cavity so as to receive the passive component on the first hot-melt dielectric layer in the cavity;
   stacking a second hot-melt dielectric layer on each of the core on each of the first hot-melt dielectric layer;
   heat pressing the first hot-melt dielectric layer and the second hot-melt dielectric layer so as to form two dielectric layer units each having an upper surface and a lower surface and each having the core board corresponding and the passive component embedded therein and the positioning pads corresponding embedded in the lower surface thereof;
   removing the carrier board and the releasing film on each of the opposite surfaces so as to separate the two dielectric layer units; and
   forming a first wiring layer on the upper surface of each of the dielectric layer units and forming a second wiring layer on the lower surface of each of the dielectric layer units, wherein the first wiring layer is electrically connected to the electrode pads of the upper surface of the passive component through a plurality of first conductive vias, and the second wiring layer is electrically connected to the electrode pads of the lower surface of the passive component through a plurality of second conductive vias.

2. The method of claim 1, wherein the electrode pads on the lower surface of the passive component correspond in position to the positioning pads, and the second conductive vias penetrate the positioning pads, respectively.

3. The method of claim 1, further comprising forming built-up structures on the upper surface of the dielectric layer unit and the first wiring layer and on the lower surface of the dielectric layer unit and the second wiring layer.

4. The method of claim 3, further comprising forming a solder mask layer on each of the built-up structures, and forming a plurality of openings in the solder mask layer such that portions of the outmost wiring layer of the built-up structure are exposed to serve as conductive pads.

\* \* \* \* \*